(12) United States Patent
Tran et al.

(10) Patent No.: US 8,556,159 B2
(45) Date of Patent: Oct. 15, 2013

(54) EMBEDDED ELECTRONIC COMPONENT

(75) Inventors: Tu-Anh N. Tran, Austin, TX (US); Burton J. Carpenter, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/404,945

(22) Filed: Feb. 24, 2012

(65) Prior Publication Data
US 2013/0221076 A1   Aug. 29, 2013

(51) Int. Cl.
*H01L 21/00* (2006.01)
*H05K 3/30* (2006.01)
*B23K 31/00* (2006.01)

(52) U.S. Cl.
USPC ....... 228/180.5; 228/179.1; 29/832; 438/106; 438/118; 438/127

(58) Field of Classification Search
USPC ............ 228/180.5, 179.1; 438/106, 118, 127; 29/832
See application file for complete search history.

(56) References Cited

U.S. PATENT DOCUMENTS

| | | | |
|---|---|---|---|
| 5,475,958 A | 12/1995 | Josefsson et al. | |
| 5,541,450 A | 7/1996 | Jones et al. | |
| 5,583,377 A | 12/1996 | Higgins, III | |
| 5,639,695 A | 6/1997 | Jones et al. | |
| 5,696,666 A | 12/1997 | Miles et al. | |
| 7,575,955 B2 * | 8/2009 | Attarwala | 438/118 |
| 7,741,158 B2 | 6/2010 | Leung et al. | |
| 7,754,530 B2 | 7/2010 | Wu et al. | |
| 7,901,981 B2 * | 3/2011 | Smeys et al. | 438/106 |
| 7,902,661 B2 | 3/2011 | Smeys et al. | |
| 7,936,567 B2 | 5/2011 | Takashima et al. | |
| 2007/0227761 A1 * | 10/2007 | Tuominen et al. | 174/252 |

OTHER PUBLICATIONS

Chang et al.; "The Warpage and Stress Simulation Study of Embedded Organic Substrate"; 5th Annual Microsystems Packaging Assembly and Circuits Technology Conference (IMPACT); 2010; 3 Pgs.; IEEE.
Meyer-Berg et al.; "KGD for Embedding Technologies"; KGD Packaging & Test Workshop 2010;3 Pgs; Infineon Technologies.
Jan Vardaman; "Trends in Embedded Substrates: Technology, Markets, and Applications"; SEMICONTaiwan; 2011; TechSearch International.
Wu et al.; "Study of Discrete Capacitor Embedded Process and Characterization Analysis in Organic-Base Substrate"; 2007 9th Electronics Packaging Technology Conference; 2007; 5 Pgs, IEEE.
"IMB Technology", 1 Pg., Imbera Electronics, Nov. 12, 2008 (The metadata of the PDF file for this reference (as found under File>Properties) states that this document was created on Nov. 12, 2008 1:09:02 PM. The meta data also states that this document was modified at that time.)

* cited by examiner

*Primary Examiner* — Devang R Patel
(74) *Attorney, Agent, or Firm* — David G. Dolezal; Joanna G. Chiu

(57) ABSTRACT

Forming an embedded electronic component includes attaching an electronic component to a first conductive layer and forming a layer stack with a first partially cured dielectric layer having a first opening and a substrate having a second opening. The partially cured dielectric layer is located over the first conductive layer and the substrate is located over the first partially cured dielectric layer such that the first and second openings surround the electronic component. Heat and pressure are applied to the layer stack such that the first partially cured dielectric layer flows for filling gaps within the first and second openings and becomes fully cured.

20 Claims, 9 Drawing Sheets

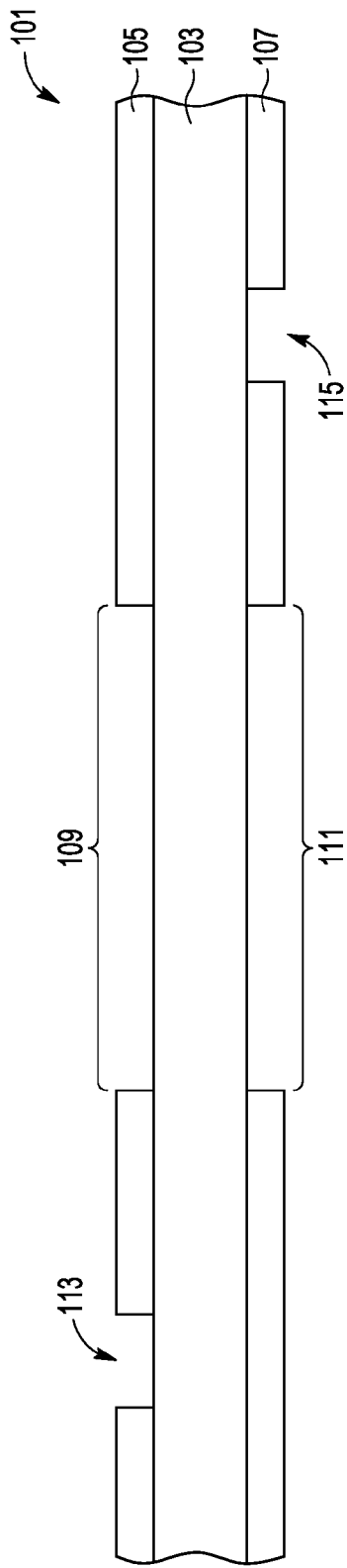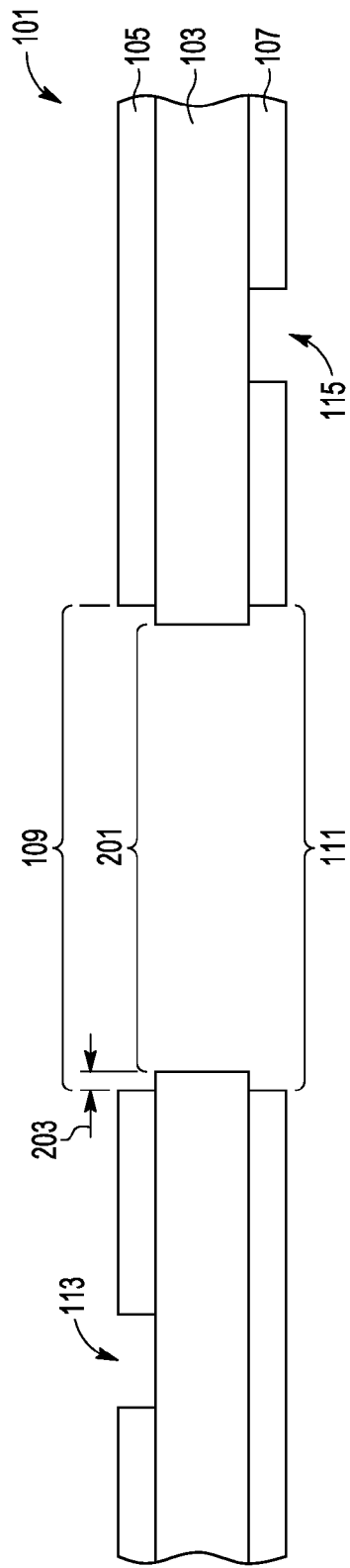

EMBEDDED ELECTRONIC COMPONENT

BACKGROUND OF THE INVENTION

1. Field of the Invention

This invention relates in general to an embedded electronic component.

2. Description of the Related Art

Embedded electronic components can be implemented with a package substrate that is used for signal routing. Examples of electronic components include discrete components such as capacitors, resistors, and oscillators and integrated circuits such as memory devices, logic, processors, MEMS devices, and analog circuitry. Integrated circuits can be implemented in a semiconductor die. A semiconductor die is a portion of a processed wafer that includes devices made of semiconductor, insulative, and conductive materials.

With some embedded electronic components, a semiconductor die is located in an opening of a dielectric layer (e.g. FR4). A layer of partially cured dielectric material (e.g. FR4) is placed over the dielectric layer and semiconductor die and subsequently processed and cured such that the space surrounding the die is filled with a dielectric material.

In another embodiment, a die is placed in an opening of a substrate that includes dielectric material and conductive structures. An adhesive material is applied between the substrate sidewalls and die. The adhesive material provides support for the die during wire bonding and encapsulation.

BRIEF DESCRIPTION OF THE DRAWINGS

The present invention may be better understood, and its numerous objects, features, and advantages made apparent to those skilled in the art by referencing the accompanying drawings.

FIGS. 1-12 show various stages in the formation of an embedded electronic component according to one embodiment of the presentation invention.

The use of the same reference symbols in different drawings indicates identical items unless otherwise noted. The Figures are not necessarily drawn to scale.

DETAILED DESCRIPTION

Figure 3:
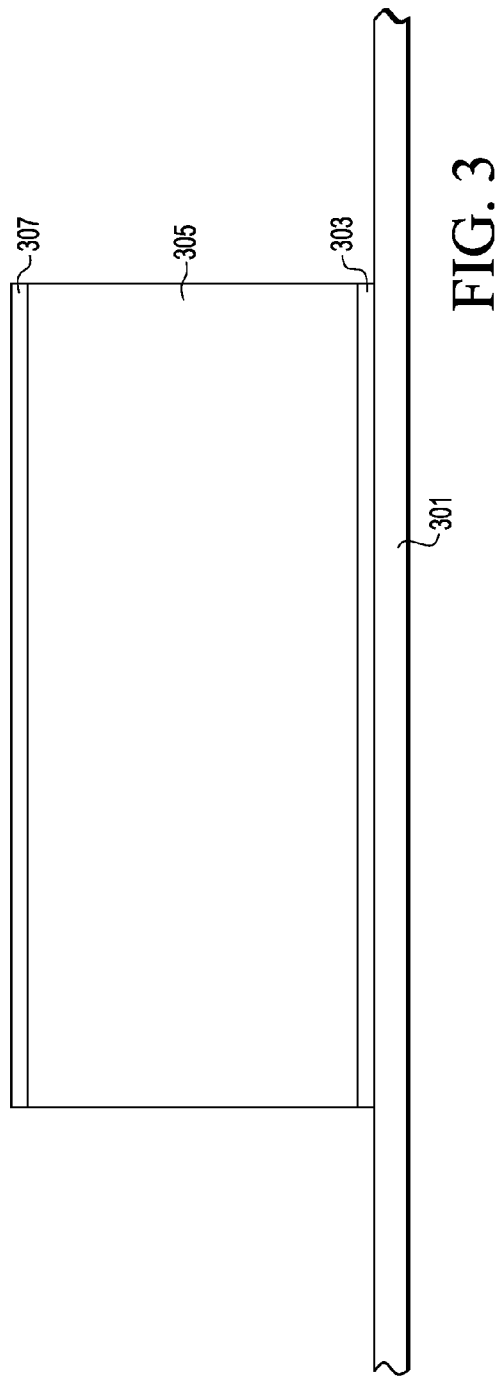

The following sets forth a detailed description of a mode for carrying out the invention. The description is intended to be illustrative of the invention and should not be taken to be limiting.

In the formation of an embedded electronic component, an electronic component is located in a layer of partial cured dielectric material. A substrate is located over the layer of partially cured dielectric material. In some embodiments, the substrate includes a layer of cured dielectric material with patterned conductive layers attached thereto and has an opening in which the electronic component is located. During the curing process where pressure and heat are applied to the layer stack, material of the partially cured dielectric layer fills space between the side walls of the substrate and the electronic component. Using such a process allows for the formation of an embedded electronic component with embedded conductive layers. Furthermore, it allows for filler material to surround the die from the bottom of the assembly.

FIG. 1 shows a partial cutaway side view of substrate 101. Substrate 101 includes a cured dielectric layer 103 having a patterned metal layer 105 located over layer 103 and a patterned metal layer 107 located beneath layer 103. Layer 105 has been patterned to form conductive routing structures for conveying signals and power supply voltages. The patterning also forms openings (e.g. 113) that allow subsequently formed vias to pass through layer 105 without being electrically connected to the layer. Layer 107 may be patterned in a similar way to form conductive routing structures and openings. Layers 105 and 107 have openings 109 and 111, respectively, in which an electronic component will be located. Although only one component opening (109 and 111) is shown in each conductive layer 105, substrate 101 may include openings for multiple electrical components.

In one embodiment, layers 105 and 107 are formed by attaching two continuous layers of a conductive material on each side of layer 103, forming a mask with selective openings on each side of substrate 101, and then subsequently etching each layer through the openings in the mask with an etchant that is selective with respect to the conductive material. In some embodiments, layers 105 and 107 may be formed by patterning a seed layer on each side of layer 103 and then subsequently plating the seed layer. However, in other embodiments, substrate 101 can be formed by other methods.

In one embodiment, conductive layers 105 and 107 are each formed of a layer of copper having a thickness in the range of 12 to 70 microns. However, in other embodiments, other conductive material and/or other thicknesses may be used.

Layer 103 is made of a dielectric material such as e.g. FR4, FR5, or bismaleimide triazine (BT). In one embodiment, layer 105 has a thickness in the range of 50-400 microns. However, layer 105 may have other thicknesses and/or be made of other materials in other embodiments. Layer 103 is considered "fully cured" in that the layer remains solid at temperatures and pressures of a subsequent lamination process (e.g. 225 C and 2-3 MPa of pressure in one embodiment).

FIG. 2 shows a partial cutaway side view of substrate 101 after an opening 201 is formed in layer 103 for a subsequently located electronic component. In one embodiment, opening 201 is formed by a stamped or punch process, but may be formed by other processes in other embodiments. In the embodiment shown, the sidewalls of layers 105 and 107 in openings 109 and 111, respectively, are recessed by a distance (e.g. distance 203) from the sidewalls of layer 103 of opening 201. In one embodiment, this distance is based on manufacturing tolerances of the punch machine. In one embodiment, this distance is 200 microns but may be of other values in other embodiments.

In other embodiments, substrate may include through hole vias (not shown) that are formed by drilling holes through layer 103 and plating layer 103. The vias may be formed prior to patterning conductive layers 105 and 107 or after such patterning. Also, in the embodiment shown, substrate 101 includes two conductive layers (105 and 107). However, in other embodiments, a substrate may include more than two conductive layers. For example, substrate 101 may include conductive layers embedded in dielectric layer 103. In other embodiments, substrate 101 may consist of only a single conductive layer. Such a single conductive layer may be a metal layer such as e.g. a copper layer or a copper plated layer.

FIG. 3 is a partial side view of an electronic component attached to a conductive layer 301 with adhesive 303. In one embodiment, the electronic component 305 is a semiconductor device (e.g. a processor, memory device, logic circuit, analog device, and/or MEMS device). A protective layer 307 is formed over component 305. In one embodiment, layer 307 is made of a protective material, e.g. polyethylene film with acrylic adhesive, and has a thickness in the range of 40 to 150 microns, but may have other thicknesses and be made of other materials in other embodiments. In one embodiment, layer 307 is formed on component 305 on a wafer prior to being diced to form component 305. In one embodiment, layer 307 may be attached to component 305 with an adhesive film that is UV releasable. In one embodiment, component 305 has a thickness in the range of 50 to 800 microns and a width in the range of 2 to 20 mm, but may have other thicknesses and other widths in other embodiments. In other embodiments, electronic component may be characterized as a discrete component such as a capacitor, resistor, inductor, or oscillator.

In one embodiment, adhesive 303 is a layer of viscous adhesive material such as e.g. a silver filled epoxy. However, adhesive 303 may be implemented by other materials e.g. such as a two sided adhesive tape.

In one embodiment, conductive layer 301 is formed from a layer of copper having a thickness in the range of 12 to 70 microns. However, in other embodiments, other conductive material and/or other thicknesses may be used. In one embodiment, layer 301 may be supported by a carrier (not shown) during the manufacturing process. In some embodiments, layer 301 may be patterned. In one embodiment, layer 301 is implemented as a flat panel of conductive material. A pick and place machine is used to place multiple electronic components at designated locations on layer 301.

Figure 4:
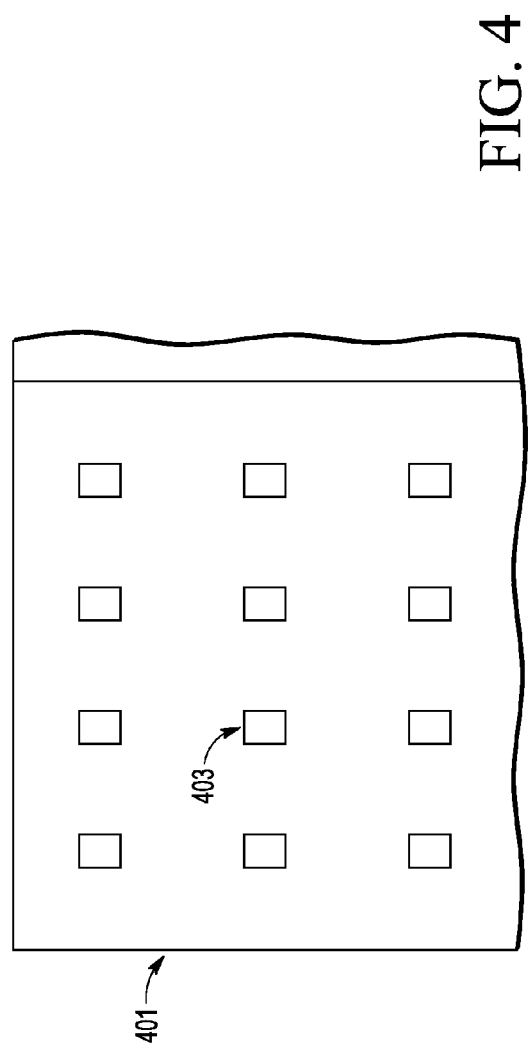

FIG. 4 shows a top view of a layer 401 of "partially cured" dielectric material. Layer 401 has been processed to include multiple openings e.g. 403 for electric components. In one embodiment, layer 401 is made from a dielectric material (e.g. such as FR4, FR5, bismaleimide triazine (BT) or other dielectric material) that is partially cured. Layer 401 is considered "partially cured" in that it flows and further cures at a lamination temperature and pressure of a subsequent lamination process. In one embodiment, layer 401 has a thickness in the range of 30-120 microns, but may have other thicknesses in other embodiments.

Figure 5:
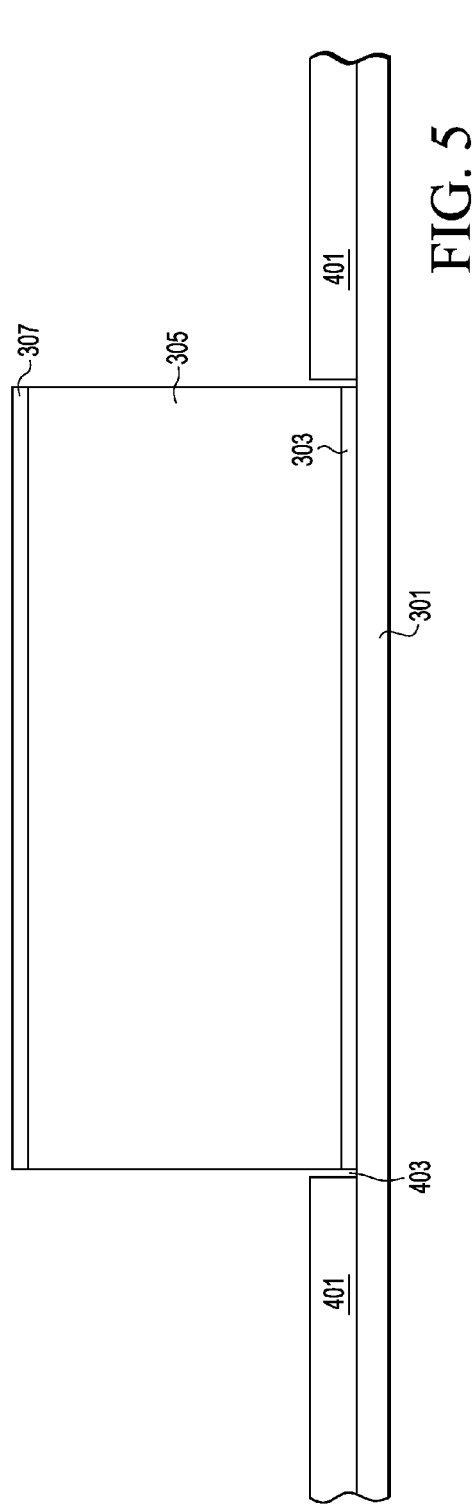

FIG. 5 is a partial side cutaway view showing electronic component 305 after partially cured layer 401 is stacked on layer 301 wherein electronic component 305 is located in an opening 403 of layer 401.

Figure 6:
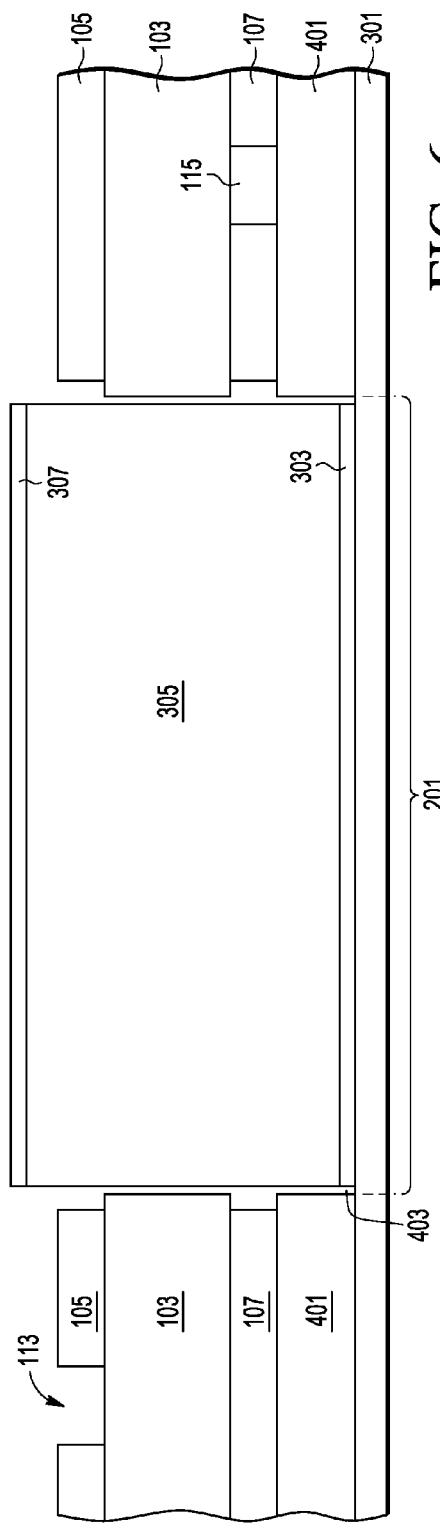

FIG. 6 shows a partial cutaway side view after substrate 101 has been stacked on layer 401 wherein the components 305 are located in component openings e.g. 201.

Figure 7:
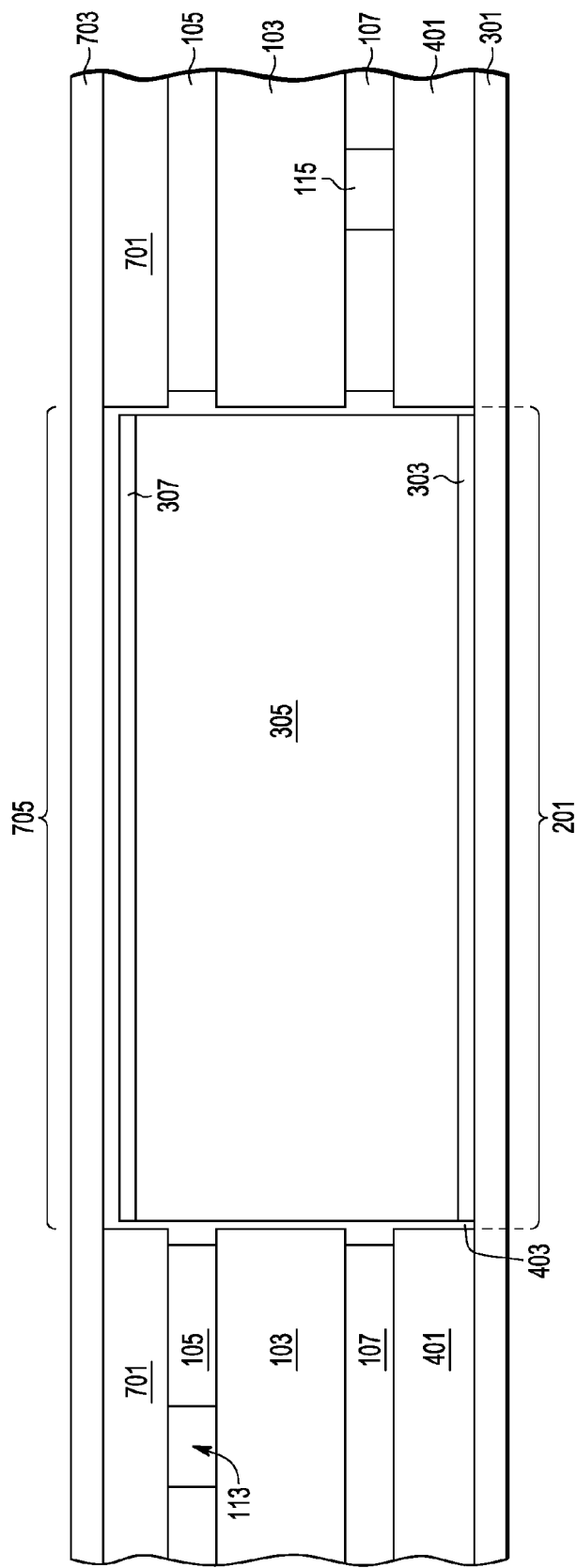

FIG. 7 shows a partial cutaway side view after another partially cured dielectric layer 701 is placed on substrate 101. In one embodiment, partially cured layer 701 is made of a dielectric material (e.g. FR4, FR5, BT). In one embodiment, it is of the same material and thickness as layer 401, but may be made of other materials and/or may have other thicknesses in other embodiments. In one embodiment, substrate 101 and layers 401 and 701 can be stacked together and then stacked on layer 301 in forming a layer stack.

After layer 701 is stacked on substrate 101, a conductive layer 703 is placed on layer 701 and on component 305. In one embodiment conductive layer 705 is made of copper and has a thickness in the range of 12 to 70 microns. However, conductive layer 703 may be made of other materials and/or have other thicknesses in other embodiments.

In the embodiment shown, layer 701 has openings (e.g. 705) where the electronic components (305) are located. In one embodiment, including openings (e.g. 705) for the electronic components in layer 701 may advantageously allow for a system where no dielectric material is located between layer 703 and component 305. With such an embodiment, such dielectric material of layer 701 does not have to be removed in subsequent processes.

Figure 8:
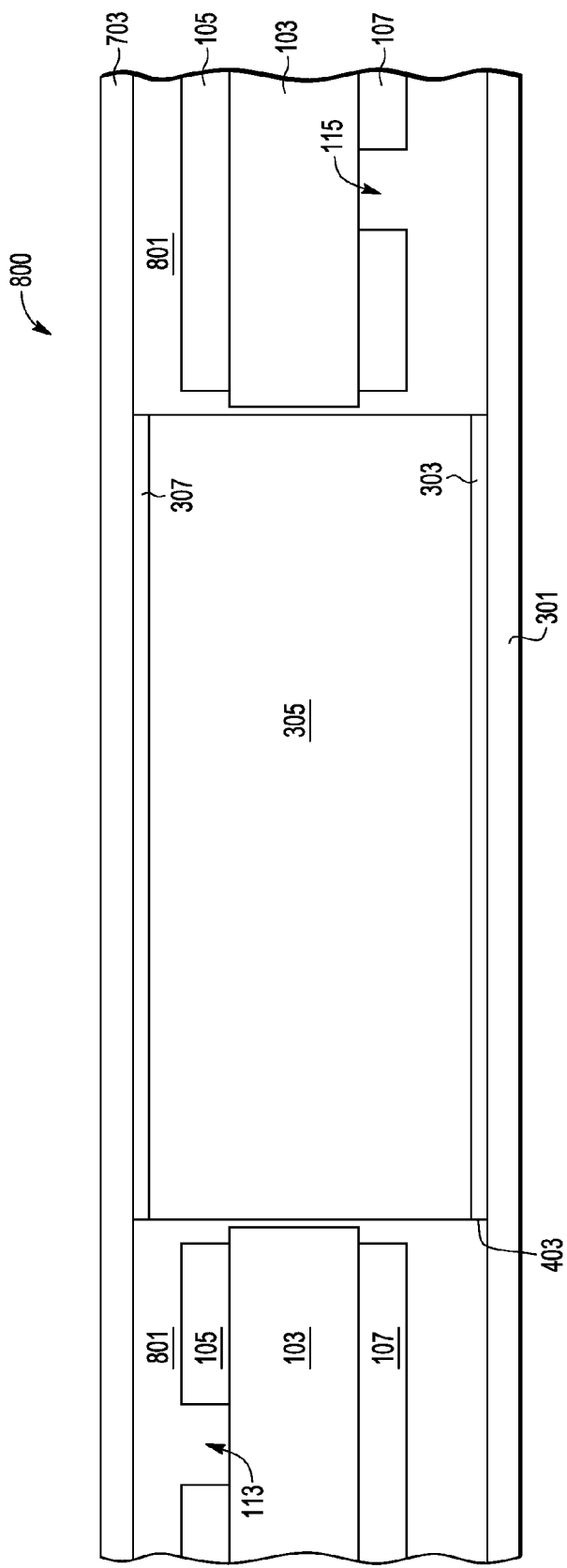

FIG. 8 shows a partial side view of a panel 800 that is formed by a lamination process where the layers shown in FIG. 7 are compressed by the application of pressure at an elevated temperature on the top and bottom of the structure of FIG. 7. During the lamination process, the material of partially cured layers 401 and 701 soften and liquefy to flow into the openings (e.g. 115 and 113) of substrate 101 and in the spaces between the electronic components (305) and substrate 101 to fill those openings and spaces. As a result of the lamination process, the material of layers 401 and 701 flows to form dielectric layer 801 and cures. In one embodiment, the lamination process is performed at a temperate of 225 C and at a pressure in the range of 2-3 Mpascals. However other lamination processes may be performed at other temperatures (e.g. between 170-180 C) and at other pressures in other embodiments. In one embodiment, layers 401 and 701 flow at the lamination temperature and pressure whereas layer 103 does not in that the cross linked density of layers 401 and 701 are lower than the cross linked density of layer 103.

Figure 9:
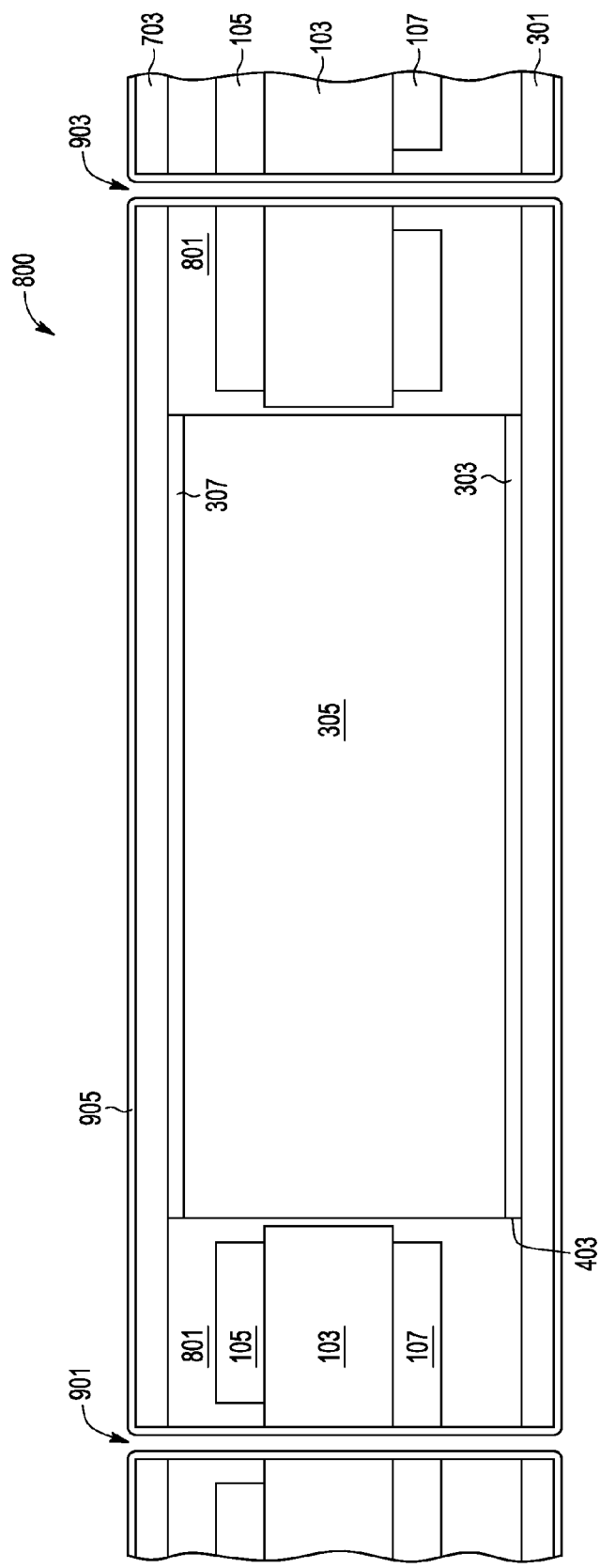

FIG. 9 shows a partial side view of panel 800 after vias are formed in the panel to couple structures of the different conductive layers. In the embodiment shown, holes 901 and 903 are formed through panel 800 and plated with plating layer 905. In one embodiment, plating layer 905 includes copper that is electroplated on panel 800. In one embodiment, plating layer 905 has a thickness in the range of 10-20 microns, but may be of other thicknesses in other embodiments. The conductive plating of hole 901 contacts conductive structures of layers 703, 107, and 301. The conductive plating of hole 903 contacts conductive structures of layers 703, 105, and 301.

In other embodiments, non through hole vias may be formed to have plating or filler material that electrically contacts conductive layers of substrate 101 but do not extend through the entire portion of panel 800. For example, openings may be formed from the top side of panel 800 to exposed conductive structures of layer 105. Also, holes may be formed from the bottom of panel 800 to expose conductive structures of layer 107. These holes are plated during the formation of layer 905. In some embodiments, the vias would be completely filled with conductive material. In some embodiments, substrate 101 would have vias connecting layers 105 and 107 formed and plated prior to the stage shown in FIG. 6.

Figure 10:
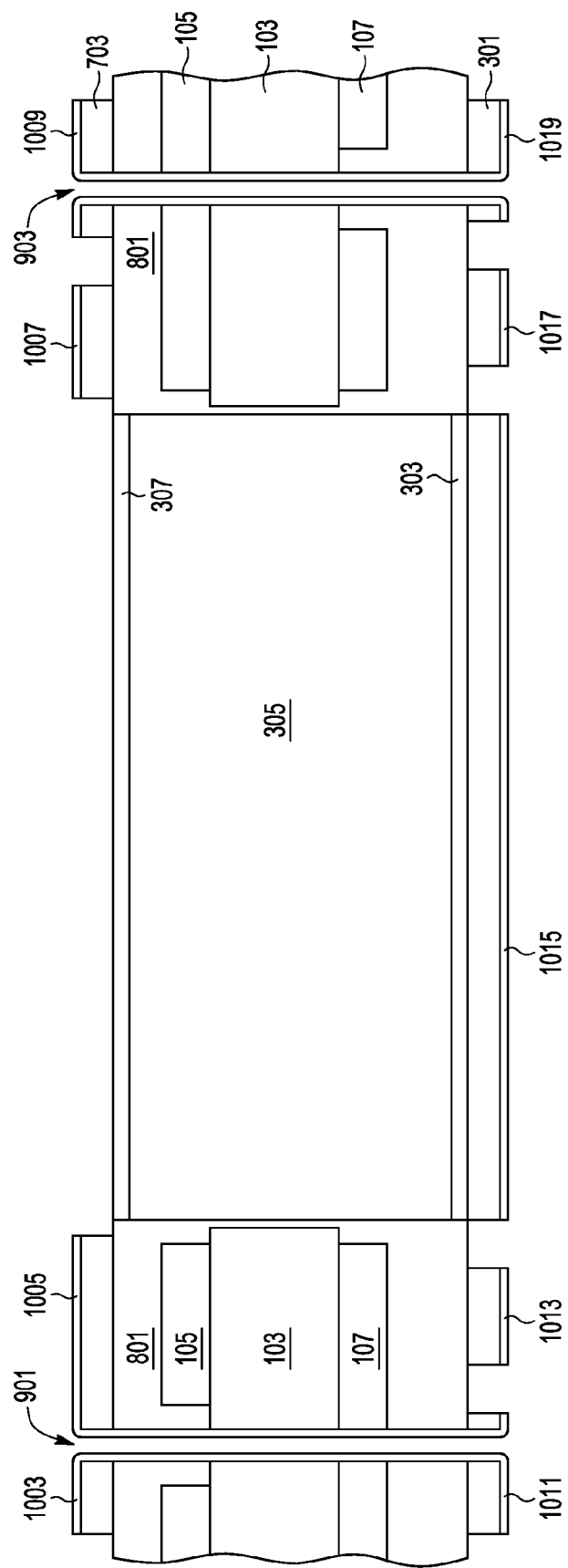

FIG. 10 shows a partial side view of panel 800 after conductive layers 703 and 301 (and the portions of layer 905 plated thereon) are patterned to form conductive structures. In one embodiment, layer 703 is patterned to form wire bond pads 1003, 1005, 1007 and 1009. In patterning layer 703, an opening is formed over component 305 to expose protective layer 307. Layer 301 is patterned to form solder ball pads 1011, 1013, 1017, and 1019. Layer 103 is also patterned to form a conductive backplane 1015 for electronic component 305. Backplane 1015 may be used for grounding purposes and/or heat dissipation. In another embodiment, solder ball pads may be formed under electronic device 305. In another embodiment, the back side of electronic device 305 may be exposed by removing portions of layer 301 and backplane 1015 and adhesive 303 at selected locations.

Figure 11:
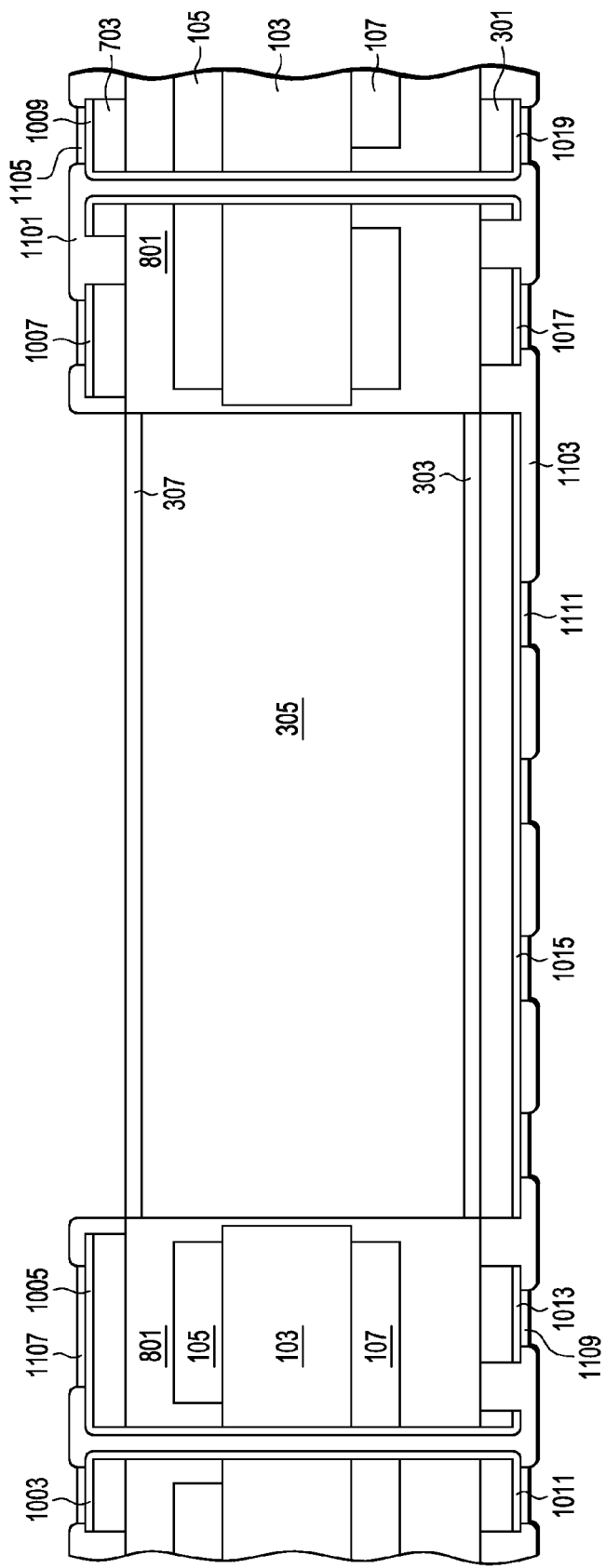

FIG. 11 shows a partial side view of panel 800 after a solder mask 1101 is formed on the top side and solder mask 1103 is formed on the bottom side of panel 800. In one embodiment, the solder masks are formed by depositing layer of a solder mask material on both sides and patterning the layer. In one embodiment, the solder masks are made of an epoxy co-polymer having an thickness in the range of 15-30 microns, but may have other thicknesses and/or be made of other materials in other embodiments.

After the formation of solder masks 1101 and 1103, wire bond pads 1003, 1005, 1007, and 1009 and solder ball pads 1011, 1013, 1017, and 1019 are plated with a plating layer (e.g. layers 1107, 1105, 1109, and 1111). In one embodiment, the plating layers are formed of a layer of nickel (e.g. 8 microns) followed by a layer of gold (e.g. 0.7 microns). However, the plating layers may have a different compensation and/or have different thicknesses in other embodiments.

Figure 12:
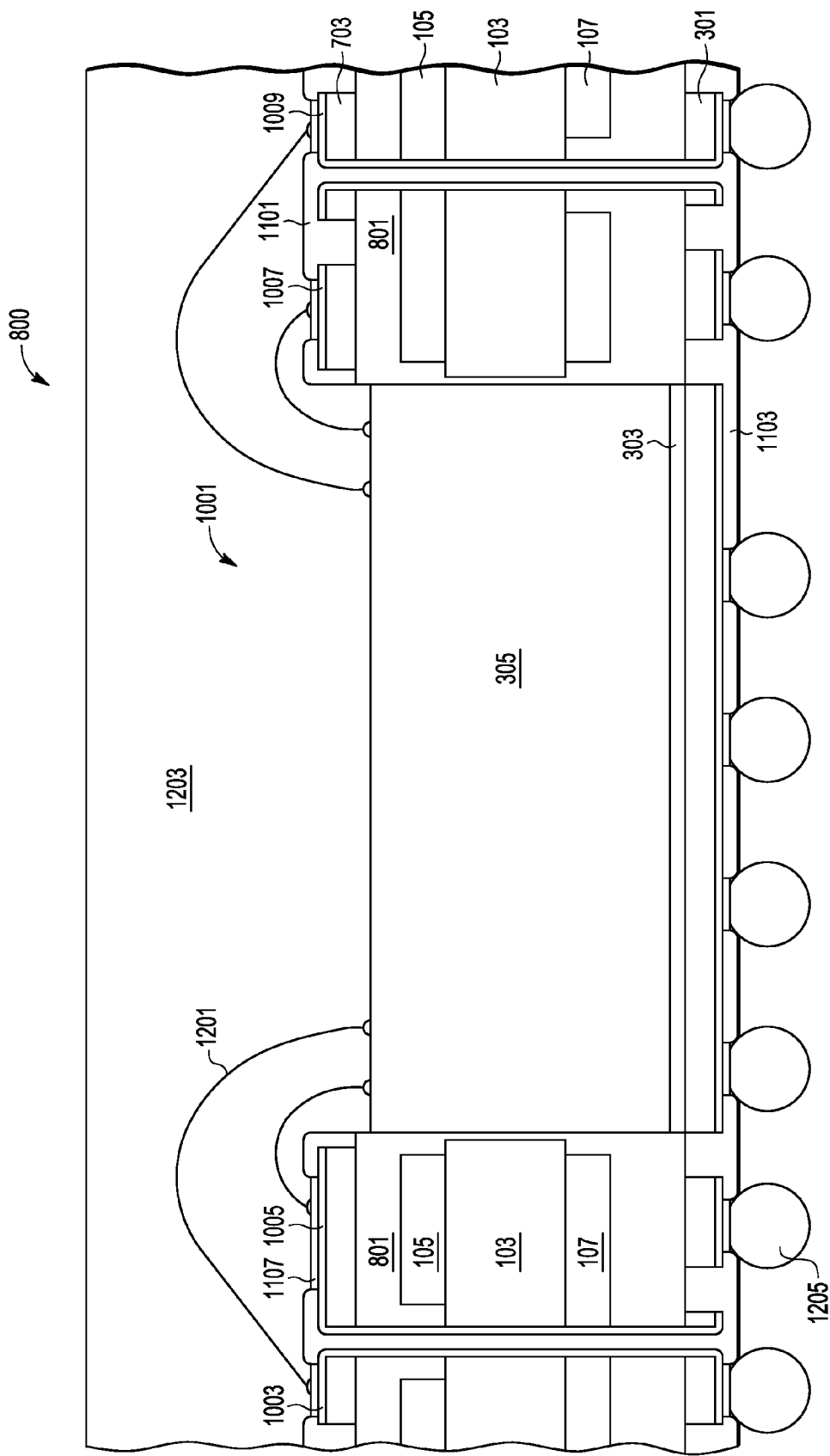

FIG. 12 shows a partial side view of panel 800 after forming wire bonds, an encapsulant, and solder balls. After forming plating layers 1107, 1105, 1109, and 1111, protective layer 307 is removed from component 305. In one embodiment, component 305 includes bonding pads that are exposed by the removal of layer 307. The exposed bonding pads are wire bonded with wire bonds (e.g. 1201) to the wire bond pads (e.g. 1007, 1009) of layer 703. After wire bonding, encapsulant 1203 is formed over the top side of panel 800. Solder balls 1205 are formed on the underneath side of panel 800.

After the formation of the solder balls, panel 800 is singulated into multiple electronic component packages. Those packages may be mounted to circuit boards to be implemented in electronic systems. In some embodiments, portions of the panel may be singulated prior to wire bonding to reduce the panel size handled by a wire bonding machine. After wire bonding, encapsulation, and solder ball attachment, the smaller panels are singulated into individual packages.

In other embodiments, component 305 may include other types of external electrical connectors. For example, panel 800 may include a redistribution layer on top of component 305 and conductive layer 703, where the redistribution layer includes conductive structures to couple the pads of component 305 to solder balls located on the top side of the panel. Also in some embodiments, package may include multiple components. For example, multiple die could be wire bonded together in a singulated package.

Forming an electronic component package with a bottom partially cured dielectric layer (e.g. 401) with an opening for an electronic component may allow for a package to have a conductive layer 301 attached to component 305. Hence a packaged device can be formed with component 305 attached to a backplane 1015, for example, for grounding or heat sinking purposes. Also, having a bottom partially cured layer below a substrate with conductive structures allows for dielectric material from the bottom layer to reflow to the space between the substrate and electronic component for a more even reflow of dielectric material. Thus, an embedded electronic component can be more optimally formed without air gaps between the substrate and electronic component. Also, using substrate 101 with two or more conductive layers allows component 305 to be embedded among multiple conductive layers.

In one embodiment, a method for forming an embedded electronic component includes attaching an electronic component to a first conductive layer and providing a partially cured dielectric layer. The partially cured dielectric layer includes a first opening. The method includes providing a patterned conductive layer. The patterned conductive layer includes a second opening. The method includes forming a layer stack including the first conductive layer, the partially cured dielectric layer, and the patterned conductive layer wherein the partially cured dielectric layer is located over the first conductive layer such that the first opening surrounds the electronic component and the patterned conductive layer is located over the partially cured dielectric layer such that the second opening surrounds the electronic component. The method includes applying pressure and heat to the layer stack such that the partially cured dielectric layer flows for filling gaps within the first and second openings and becomes fully cured.

In another embodiment, a method for forming an embedded electronic component comprises attaching a first major surface of an electronic component to a first conductive layer and providing a first partially cured dielectric layer. The first partially cured dielectric layer includes a first opening. The method includes providing a fully cured dielectric layer with a first patterned metal layer on a first major surface of the fully cured dielectric layer and a second patterned metal layer on a second major surface of the fully cured dielectric layer. The fully cured dielectric layer includes a second opening. The method includes providing a second partially cured dielectric layer. The second partially cured dielectric layer includes a third opening. The method includes providing a second conductive layer and forming a layer stack with the first conductive layer, the first partially cured dielectric layer, the fully cured dielectric layer, the second partially cured dielectric layer, and the second conductive layer. The first partially cured dielectric layer is located over the first conductive layer such that the first opening surrounds the electronic component, the fully cured dielectric layer is located over the first partially cured dielectric layer such that the second opening surrounds the electronic component, the second partially cured dielectric layer is located over the fully cured dielectric layer such that the third opening surrounds the electronic component, and the second conductive layer is located over the second partially cured dielectric layer and the electronic component. The method includes applying pressure and heat to the layer stack such that the first and second partially cured dielectric layers flow for filling gaps within the first, second, and third openings and become fully cured. During the applying pressure and heat, the fully cured dielectric layer remains solid.

In another embodiment, a method for forming an embedded electronic component includes attaching a first major surface of an electronic component to a first conductive layer and providing a first partially cured dielectric layer. The first partially cured dielectric layer includes a first opening. The method includes providing a metal layer that includes a second opening and providing a second partially cured dielectric layer. The second partially cured dielectric layer includes a third opening. The method includes providing a second conductive layer and forming a layer stack with the first conductive layer, the first partially cured dielectric layer, the metal layer, the second partially cured dielectric layer, and the second conductive layer. The first partially cured dielectric layer is located over the first conductive layer such that the first opening surrounds the electronic component, the metal layer is located over the first partially cured dielectric layer such that the second opening surrounds the electronic component, the second partially cured dielectric layer is located over the metal layer such that the third opening surrounds the electronic component, and the second conductive layer is located over the second partially cured dielectric layer and the electronic component. The method includes applying pressure and heat to the layer stack such that the first and second partially cured dielectric layers flow for filling gaps within the first, second, and third openings and become fully cured. During the applying pressure and heat, the fully cured dielectric layer remains solid.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming an embedded electronic component, the method comprising:
   attaching an electronic component to a first conductive layer;
   providing a partially cured dielectric layer, wherein the partially cured dielectric layer includes a first opening;
   providing a patterned conductive layer, wherein the patterned conductive layer includes a second opening;
   forming a layer stack including the first conductive layer, the partially cured dielectric layer, and the patterned conductive layer wherein the partially cured dielectric layer is located over the first conductive layer such that the first opening surrounds the electronic component and the patterned conductive layer is located over the partially cured dielectric layer such that the second opening surrounds the electronic component; and
   applying pressure and heat to the layer stack such that the partially cured dielectric layer flows for filling gaps within the first and second openings and becomes fully cured, wherein the electronic component is located in the layer stack during the applying pressure and heat.

2. The method of claim 1 wherein the patterned conductive layer is attached to a fully cured dielectric layer, wherein the fully cured dielectric layer includes a third opening, wherein the layer stack includes the fully cured dielectric layer located over the partially cured dielectric layer such that the third opening surrounds the electronic component, wherein the applying pressure and heat includes applying pressure and heat to the fully cured dielectric layer, wherein during the applying pressure and heat, the fully cured dielectric layer remains solid.

3. The method of claim 2, wherein the patterned conductive layer is located between the partially cured dielectric layer and fully cured dielectric layer in the layer stack, wherein a second patterned conductive layer is attached to the fully cured dielectric layer on an opposite side to the patterned conductive layer, wherein the second patterned conductive layer includes a fourth opening, wherein the forming the layer stack includes forming the layer stack with the second patterned conductive layer such that the fourth opening surrounds the electronic component.

4. The method of claim 1, further comprising:
   providing a second partially cured dielectric layer, wherein the second partially cured dielectric layer includes a third opening; and
   the forming the layer stack includes forming the layer stack with the second partially cured dielectric layer over the patterned conductive layer such that the third opening surrounds the electronic component.

5. The method of claim 4, wherein the applying the pressure and heat is performed such that the partially cured dielectric layer and the second partially cured dielectric layer flow for filling gaps within the first, second, and third openings and become fully cured.

6. The method of claim 4, wherein the forming the layer stack includes forming the layer stack with a second conductive layer located over the second partially cured dielectric layer and the electronic component.

7. The method of claim 1 wherein the forming the layer stack includes forming the layer stack with a second conductive layer located over the patterned conductive layer and the electronic component.

8. The method of claim 7, further comprising:
   after the applying pressure and heat, forming plated through vias which extend from the second conductive layer to the first conductive layer.

9. The method of claim 7, further comprising:
   after the applying the pressure and heat, patterning the first conductive layer and patterning the second conductive layer.

10. The method of claim 9 further comprising:
    after patterning the first conductive layer, forming a first solder mask attached to the first conductive layer; and
    after patterning the second conductive layer, forming a second solder mask attached to the second conductive layer.

11. The method of claim 9, wherein the patterning the second conductive layer comprises forming a third opening in the second conductive layer which overlies the electronic component, wherein the electronic component comprises a protective layer over a top surface of the electronic component, wherein after forming the third opening, the method further comprises:
    removing the protective layer through the third opening.

12. The method of claim 9 wherein the patterning the second conductive layer forms a wire bond pad, the method comprising:
    wire bonding the wire bond pad to a bond pad of the electronic component.

13. A method for forming an embedded electronic component, the method comprising:
    attaching a first major surface of an electronic component to a first conductive layer;
    providing a first partially cured dielectric layer, wherein the first partially cured dielectric layer includes a first opening;
    providing a fully cured dielectric layer with a first patterned metal layer on a first major surface of the fully cured dielectric layer and a second patterned metal layer on a second major surface of the fully cured dielectric layer, wherein the fully cured dielectric layer includes a second opening;
    providing a second partially cured dielectric layer, wherein the second partially cured dielectric layer includes a third opening;
    providing a second conductive layer;
    forming a layer stack with the first conductive layer, the first partially cured dielectric layer, the fully cured dielectric layer, the second partially cured dielectric layer, and the second conductive layer wherein the first partially cured dielectric layer is located over the first conductive layer such that the first opening surrounds the electronic component, the fully cured dielectric layer is located over the first partially cured dielectric layer such that the second opening surrounds the electronic component, the second partially cured dielectric layer is located over the fully cured dielectric layer such that the third opening surrounds the electronic component, and the second conductive layer is located over the second partially cured dielectric layer and the electronic component;
    applying pressure and heat to the layer stack such that the first and second partially cured dielectric layers flow for filling gaps within the first, second, and third openings and become fully cured, wherein during the applying pressure and heat, the fully cured dielectric layer remains solid.

14. The method of claim 13, further comprising:
    after the applying pressure and heat, patterning the first conductive layer and the second conductive layer.

15. The method of claim 14, wherein a second major surface of the electronic component comprises a protective film, wherein patterning the second conductive layer comprises:

opening the second conductive layer to expose the protective film; and forming wire bond pads from the second conductive layer.

16. The method of claim 15, further comprising:

removing the protective film through an opening in the second conductive layer to expose at least one bond pad of the electronic component;

wire bonding a wire bond pad formed form the second conductive layer to a bond pad of the electronic component.

17. The method of claim 14, wherein patterning the first conductive layer comprises leaving a portion of the first conductive layer attached to the electronic component.

18. The method of claim 14, further comprising:

after the patterning, forming a first solder mask layer attached to the first conductive layer, forming a second solder mask layer attached to the second conductive layer, wherein the first solder mask layer comprises a first plurality of openings and the second solder mask layer comprises a second plurality of openings;

forming a metal within the first and second plurality of openings.

19. The method of claim 13, further comprising:

after the applying pressure and heat, forming plated through vias which extend from the second conductive layer to the first conductive layer.

20. A method for forming an embedded electronic component, the method comprising:

attaching a first major surface of an electronic component to a first conductive layer;

providing a first partially cured dielectric layer, wherein the first partially cured dielectric layer includes a first opening;

providing a metal layer that includes a second opening;

providing a second partially cured dielectric layer, wherein the second partially cured dielectric layer includes a third opening;

providing a second conductive layer;

forming a layer stack with the first conductive layer, the first partially cured dielectric layer, the metal layer, the second partially cured dielectric layer, and the second conductive layer wherein the first partially cured dielectric layer is located over the first conductive layer such that the first opening surrounds the electronic component, the metal layer is located over the first partially cured dielectric layer such that the second opening surrounds the electronic component, the second partially cured dielectric layer is located over the metal layer such that the third opening surrounds the electronic component, and the second conductive layer is located over the second partially cured dielectric layer and the electronic component;

applying pressure and heat to the layer stack such that the first and second partially cured dielectric layers flow for filling gaps within the first, second, and third openings and become fully cured, wherein the electronic component is located in the layer stack during the applying pressure and heat.

* * * * *